(12) United States Patent
Nishio et al.

(10) Patent No.: US 6,986,072 B2
(45) Date of Patent: *Jan. 10, 2006

(54) REGISTER CAPABLE OF CORRESPONDING TO WIDE FREQUENCY BAND AND SIGNAL GENERATING METHOD USING THE SAME

(75) Inventors: Yoji Nishio, Tokyo (JP); Seiji Funaba, Tokyo (JP); Kayoko Shibata, Tokyo (JP); Toshio Sugano, Tokyo (JP); Hiroaki Ikeda, Tokyo (JP); Takuo Iizuka, Gunma (JP); Masayuki Sorimachi, Gunma (JP)

(73) Assignees: Elpida Memory, Inc., Tokyo (JP); Hitachi Tohbu Semiconductor, Ltd., Tokyo (JP); Hitachi, Ltd., Gunma (JP)

( * ) Notice: Subject to any disclaimer, the term of this patent is extended or adjusted under 35 U.S.C. 154(b) by 539 days.

This patent is subject to a terminal disclaimer.

(21) Appl. No.: 10/206,822

(22) Filed: Jul. 29, 2002

(65) Prior Publication Data

US 2003/0025540 A1    Feb. 6, 2003

(30) Foreign Application Priority Data

Jul. 30, 2001 (JP) ............................. 2001-229039

(51) Int. Cl.
*G11C 7/08* (2006.01)
*G06F 1/06* (2006.01)
*G06F 1/10* (2006.01)

(52) U.S. Cl. ................ 713/401; 365/189.01; 365/205; 365/240; 365/194

(58) Field of Classification Search ................ 713/300, 713/500–601, 401; 365/194, 240, 205, 189.01
See application file for complete search history.

(56) References Cited

U.S. PATENT DOCUMENTS

| | | | | |
|---|---|---|---|---|
| 5,561,466 A * | 10/1996 | Kiriyama | ............... | 375/240.25 |
| 6,003,118 A * | 12/1999 | Chen | .......................... | 711/167 |
| 6,088,774 A | 7/2000 | Gillingham | | |
| 6,115,318 A | 9/2000 | Keeth | | |
| 6,131,149 A | 10/2000 | Lu et al. | | |
| 6,166,973 A * | 12/2000 | Shinozaki | .................... | 365/200 |
| 6,333,893 B1 * | 12/2001 | Keeth et al. | ................. | 365/233 |
| 6,359,815 B1 * | 3/2002 | Sato et al. | ................... | 365/198 |
| 6,407,963 B1 * | 6/2002 | Sonoda et al. | ........... | 365/233.5 |
| 6,510,087 B2 * | 1/2003 | Kudou et al. | .......... | 365/189.05 |
| 6,556,494 B2 * | 4/2003 | Morzano et al. | ............ | 365/219 |
| 6,696,872 B1 * | 2/2004 | Le et al. | ..................... | 327/158 |
| 6,707,726 B2 * | 3/2004 | Nishio et al. | .......... | 365/189.12 |
| 6,819,177 B2 * | 11/2004 | Ruha et al. | ............. | 330/207 A |

* cited by examiner

*Primary Examiner*—Thuan Su
*Assistant Examiner*—Anand B. Patel
(74) *Attorney, Agent, or Firm*—Foley & Lardner LLP

(57) ABSTRACT

A maximum value of the number of mounted memory devices is assumed, and a value of an external delay replica is fixed and set. A desired frequency band is divided into a plurality of sub-frequency bands, and delay times of an output buffer and an internal delay replica are switched and used every sub-frequency band, thereby setting an actual maximum value and an actual minimum value to the internal delay replica. A selecting pin can select the delay time in the internal delay replica. Thus, it is possible to sufficiently ensure a set-up time and a hold time of an internal clock signal generated by a delay locked loop circuit in the latch operation in a register within a desired frequency band and with a permittable number of memory devices, irrespective of the frequency level and the number of mounted memory devices.

18 Claims, 5 Drawing Sheets

REGISTER CAPABLE OF CORRESPONDING TO WIDE FREQUENCY BAND AND SIGNAL GENERATING METHOD USING THE SAME

BACKGROUND OF THE INVENTION

The present invention relates to a registered memory module and, more particularly, to a memory module having a delay locked loop (hereinafter, referred to as a DLL) circuit in a register.

A technology using stub bustopology for a DQ bus and a clock bus (hereinafter, referred to as a related art) has been proposed for purpose of response to a high frequency band. In the related art, an external clock signal WCLK transmitted from a chip set (or memory controller) is distributed into a plurality of memory devices arranged on a substrate of each memory module. Meanwhile, in the related art, a command/address (hereinafter, referred to as a C/A) signal transmitted from the chip set to the memory module via an external C/A bus is latched to a C/A register (hereinafter, referred to as a register) arranged on the substrate of each memory module. Thereafter, the latched C/A signal is distributed into a corresponding memory device via an internal C/A bus from the register to each memory device, as an internal C/A signal.

Currently, a large number of types of memory modules having four to eighteen memory devices, depending on whether or not an ECC function is provided or whether or not which capacity is realized, have come into a market. Operating frequencies of the memory devices mounted on the single memory module are varied. On the other hand, in the related art, a method using an individual register is used corresponding to the operating frequencies and to the number of mounted memory devices. Because a set-up time and a hold time in a flip-flop forming a latch circuit are held to be appropriate.

However, the efficiency of parts in the case of designing and producing the single register capable of corresponding to any operating frequency and to any the number of mounted memory devices are higher than that in the case of designing and producing individual registers corresponding to operating frequencies and the number of mounted memory devices. In other words, a request is the appearance of a register independent of the number of mounted memory devices, capable of corresponding to a requested used frequency band. The used frequency band has, for example, a clock frequency of 200 to 300 MHz.

SUMMARY OF THE INVENTION

Accordingly, it is one object of the present invention to provide a register capable of corresponding to a wide frequency band, independent of the number of mounted memory devices.

In order to solve the above-mentioned problems, in the present invention, a DLL circuit is arranged in the register. The DLL circuit controls the delay operation in accordance with an external clock signal distributed by a chip set by using an external delay replica arranged outside the register and an internal delay replica arranged in the register, and generates an internal clock signal for prescribing the latch operation. The external delay replica indicates a propagation delay time on an internal C/A bus from the register to the memory device. The internal delay replica indicates a delay time in an output unit of the register (corresponding to an internal C/A bus drive comprising a buffer and an inverter). The delay control of the DLL circuit front-loads the external clock signal by a total delay time indicated by the external delay replica and the internal delay replica.

Next, four to eighteen mounted memory devices, which are widely used in the present, are assumed. A desired frequency band ranges 200 to 300 MHz. Then, the latch operation in the flip-flop in the register is simulated. In particular, a fixed appropriate time (1600 ps) is set to the external delay replica so as to correspond to the eighteen mounted memory devices having the longest propagation delay time from the register and to the memory device.

As a result, it is found that the delay characteristics requested to the output unit (output buffer) of the register depend on a frequency of the used external clock signal.

However, the setting of the delay characteristics of a single output buffer, that is, of the single internal delay replica can correspond to the entire delay frequency mentioned above. Specifically, if a minimum time of the delay of the output buffer (internal delay replica) can be set to 1580 ps and a maximum time thereof can be set to 1720 ps based on the simulation and the examination, the single register can correspond to the entire desired frequency band. However, since a rate of the maximum value to the minimum value is approximately 1.09, that is, small, a normal circuit cannot realize the above-mentioned correspondence. Then, in consideration of the delay time of the formed output buffer (internal delay replica), the desired frequency band is divided into two bands of a band of 200 to 250 MHz (first sub-frequency band) and a band of 250 to 300 MHz (second sub-frequency band). Further, the output buffer (internal delay replica) is formed to have delay times corresponding to the two frequency bands. The delay time of the output buffer (internal delay replica) is switched in accordance with the sub-frequency band to which the used frequency belongs.

Concretely, to solve the above-mentioned problems, the present invention provides a register for a registered memory module having the following specific configuration based on the above consideration.

According to a first aspect of the present invention, there is provided a register mounted on a memory module including a plurality of memory devices. An external clock signal and a command/address (hereinafter, referred to as a C/A) signal are supplied to the register from a chip set outside the memory module. The register generates an internal clock signal from the external clock signal, fetches a C/A signal in accordance with the internal clock signal, and thereby generates an internal C/A signal for the memory device. An external delay replica indicating a propagation delay signal corresponding to a reach time of the internal C/A signal to a plurality of memory devices is connected to the register. The register forms an internal delay replica indicating a delay time for generating the internal C/A signal corresponding to the internal clock signal therefrom and a delay control loop together with the internal delay replica and the external delay replica. The register includes an delay locked loop circuit for generating the internal clock signal by front-loading the external clock signal by a predetermined time indicated by the internal delay replica and the external delay replica, a flip-flop for latching the C/A signal in accordance with the internal clock signal and generating an intermediate C/A signal, and an output unit for buffering the intermediate C/A signal and outputting the internal C/A signal.

In the register of the first aspect of the present invention, the output unit and the internal delay replica have a plurality of switchable delay times, respectively.

Preferably, the register further comprises a selecting unit for selecting outside the register, one of a plurality of delay times of the output unit and the internal delay replica.

According to a second aspect of the present invention, there is provided a memory module comprising a register, an external delay replica connected to the register, and a plurality of memory devices, wherein a propagation delay time as a reach time of an internal C/A signal from the register to a plurality of memory devices corresponds to a case in which the number of memory devices is a maximum value within a predetermined number range.

According to a third aspect of the present invention, there is provided a memory system including the memory module and a chip set.

According to a fourth aspect of the present invention, there is provided a memory system provided for a memory module including a plurality of memory devices, comprising a register for receiving an external clock signal and a C/A signal from a chip set outside the memory module and generating an internal C/A signal for the memory devices. In this case, the register comprises a delay locked loop (DLL) circuit for receiving the external clock signal and generating an internal clock signal in accordance with a predetermined delay time. The necessary number of external clocks from a rising edge of the external clock signal for fetching the C/A signal to the register to a timing for fetching the internal C/A signal corresponding to the C/A signal to the memory device by the external clock signal is 1.5.

According to a fifth aspect of the present invention, there is provided the following signal generating method.

That is, in the signal generating method according to the fifth aspect of the present invention, a register is mounted on a memory module including a plurality of memory devices. The register receives a C/A signal from a chip set outside the memory module and generates an internal C/A signal of the memory device. The register comprises a delay locked loop (DLL) circuit for controlling the delay of a plurality of external clock signals and generating an internal clock signal by using a first delay replica having a propagation delay time as a reach time of the internal C/A signal to the memory device and a second delay replica indicating a delay time of an output unit in the register, and a flip-flop for latching the C/A signal in accordance with the internal clock signal and generating a signal corresponding to the internal C/A signal.

Further, according to the fifth aspect of the present invention, the signal generating method is a method for, as long as a frequency of the external clock signal belongs to a predetermined frequency band and the number of the memory devices belongs to a predetermined number range, generating the internal C/A signal corresponding to any level of the frequency of the external clock signal and any number of the memory devices. In the signal generating method, the first delay replica is fixed and set corresponding to a maximum value within the predetermined number range, the predetermined frequency band is divided into a plurality of sub-frequency bands, the delay time indicated by the second delay replica is set to be switched for each of the plurality of sub-frequency bands, and the delay time of the second delay replica is switched in accordance with the sub-frequency band, to which the frequency of the external clock signal that is actually used belongs, among the plurality of sub-frequency bands.

DESCRIPTION OF THE PREFERRED EMBODIMENTS

A detailed description is given of a register and a registered memory module having the register according to an embodiment of the present invention with reference to FIGS. 1 to 5.

According to the embodiment of the present invention, the register can correspond to a memory module having four to eighteen memory devices and can further correspond to an operating frequency band of 200 to 300 MHz. Before describing the register in detail, a description is given of the entire structure of the registered memory module, a clock generator, a chip set, and the like. Herein, as the memory device, a memory module having total eighteen DRAM devices including nine DRAM devices in each side is described. According to the embodiment, the memory module is used by being inserted into a socket arranged on a mother board of a computer.

Figure 1:
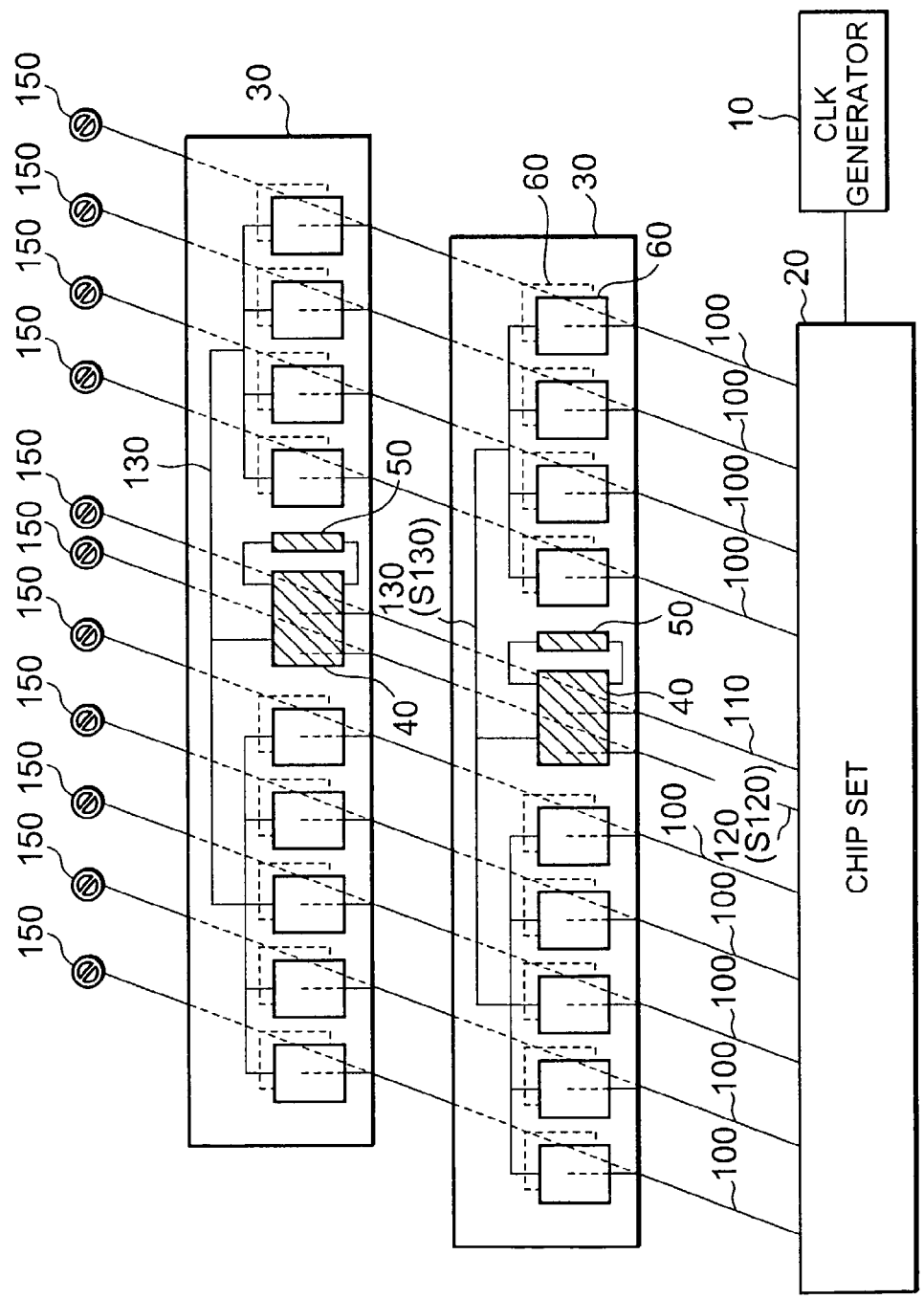
FIG. 1 is a schematic diagram showing an operating environment of a memory module according to an embodiment of the present invention.

Referring to FIG. 1, the mother board (not shown) comprises a clock generator 10, a chip set 20, and a plurality of memory modules 30. The clock generator 10 and the chip set 20 form a memory system according to the embodiment, together with the memory module 30. Each memory module 30 comprises a register 40, an external delay replica 50, and a plurality of DRAM devices 60, all of which are mounted thereon.

The clock generator 10 supplies a basic clock to the chip set 20. The chip set 20 supplies a C/A signal S120 or the like to the register 40 of the memory module 30 in accordance with the basic clock. As will be described later, the register 40 comprises a DLL circuit and an internal delay replica. The register 40 generates an internal C/A signal S130 in accordance with the C/A signal S120 and transmits the generated signal to each DRAM device 60 while controlling the amount of delay in the DLL circuit by using the internal delay replica and the external delay replica 50.

The external delay replica 50 is common to all the DRAM devices 60 on the memory modules 30. That is, according to the embodiment, the external delay replica 50 is set corresponding to all the four to eighteen DRAM devices 60. Specifically, a maximum value of the number of the corresponding provided DRAM devices, namely, a delay time (1600 ps) from the register 40 to the DRAM device 60 in the case of providing the eighteen DRAM devices is set to the external delay replica 50.

More specifically, according to the embodiment, a DQ bus (not shown) and WCLK bus 100 and 110 have a 92 stub structure. In particular, the WCLK bus 100 for the DRAM device 60 is arranged every DRAM device 60 mounted on one side of the memory module 30. A clock supplied to the WCLK bus 100 for the DRAM device 60 is referred as a clock WCLKd so as to be distinguished from a clock WCLK supplied to the WCLK bus 110 for the register 40.

Then, according to the embodiment, the WCLK bus 100 propagates a complementary signal consisting of the external clock signal WCLKd for the DRAM device 60 and an inverse signal WCLKd_b of the external clock signal WCLKd. Reference symbol "_b" means inversion and the other following referred signals are the same as that. The WCLK bus 110 propagates a complementary signal consisting of the external clock signal WCLK and an inverse signal WCLK_b of the external clock signal WCLK. A bus (external C/A bus) 120 for the C/A signal S120 transmitted to the memory module 30 from the chip set 20 has approximately 25 stub structures. The buses having the stub structures are terminated by a terminating resistor 150. A bus (internal C/A bus) 130 for the internal C/A signal S130 transmitted to each DRAM device 60 from the register 40 uses a two-stepped bus structure (hereinafter, referred to as a dual T-branch structure).

As will be understood from the above description, the external delay replica 50 can be set in consideration of the propagation delay on the internal C/A bus 130 when the number of mounted DRAM devices is maximum.

Figure 2:
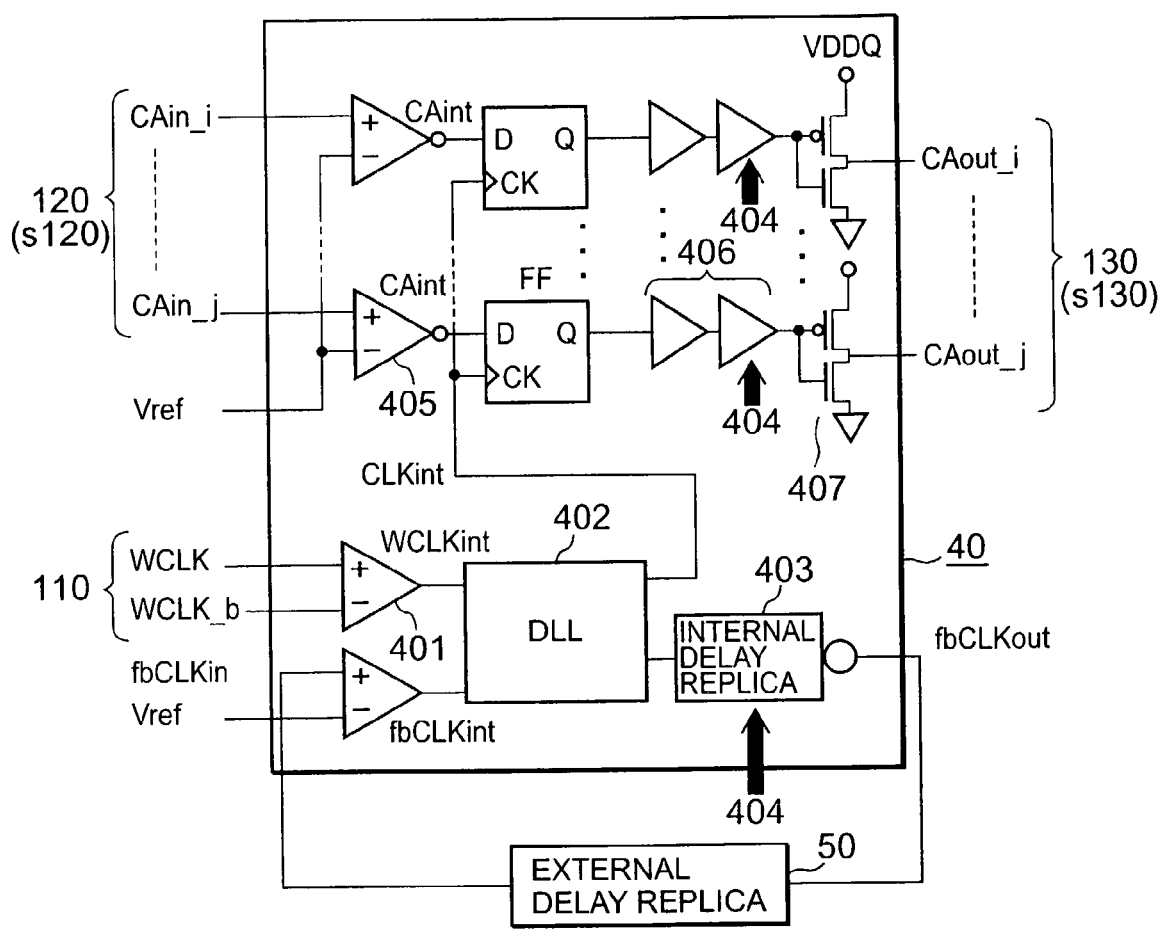
FIG. 2 is a diagram showing the schematic structure of a register according to the embodiment of the present invention.

Referring to FIG. 2, the register 40 comprises an input circuit 401 for clock, a DLL circuit 402, and an internal delay replica 403. The input circuit 401 for clock inputs the external clock signal WCLK and the inverse signal WCLK_b, and generates a clock signal WCLKint. That is, the clock signal WCLKint is generated by using a cross point between the external clock signal WCLK and the inverse signal WCLK_b, and is an adjusted clock signal WCLK whose influence of the change in voltage is suppressed. The DLL circuit 402 receives the clock signal WCLKint, controls the delay by using the internal delay replica 403 and the external delay replica 50, and generates an internal clock signal CLKint.

Herein, the internal clock signal CLKint is a clock signal obtained by front-loading the external clock signal WCLK inputted to the register 40 by a predetermined delay time. The delay time is equal to the sum of a delay time prescribed by the internal delay replica 403 and a delay time prescribed by the external delay replica 50. The delay time prescribed by the internal delay replica 403 corresponds to an output-buffer delay time in the output unit of the register 40. The output-buffer delay time is a delay time from the internal clock signal CLKint to an internal C/A signal CAout (S130 in FIG. 1). The output unit of the register 40 comprises a drive having a pre-drive 406 and an output inverter 407. The delay time prescribed by the external delay replica 50 indicates a propagation delay time of the internal C/A signal CAout (S130) on the memory module 30. The propagation delay time is a reach time of the internal C/A signal CAout to the DRAM device 60.

In detail, the delay time of the output buffer in the register 40 and the propagation delay time of the internal delay replica 403 are set so that under a condition to divide the used frequency band into first and second sub-frequency bands, the delay times can correspond to the first and second sub-frequency bands.

Figure 3:
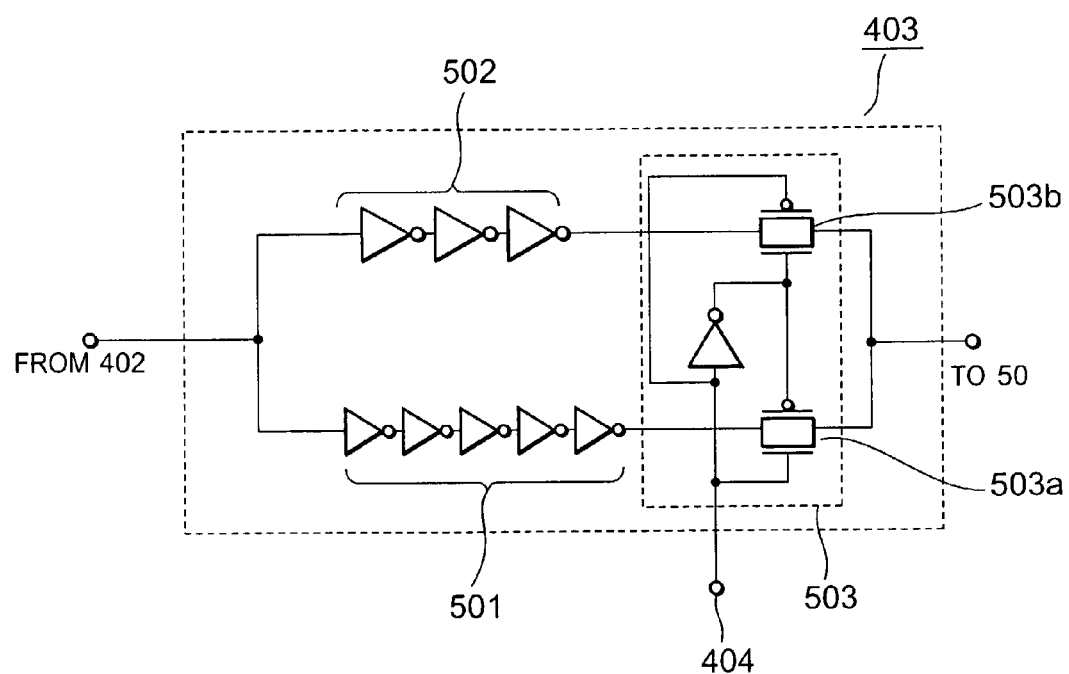
FIG. 3 is a diagram showing an example of the structure of an internal delay replica shown in FIG. 2.

FIG. 3 shows an example of the structure of the internal delay replica 403. The internal delay replica 403 comprises a first delay circuit 501 and a second delay circuit 502 which are in parallel therewith, and a selector 503 which is connected to output sides of the first delay circuit 501 and the second delay circuit 502. In the first delay circuit 501, five inverters are serially connected. In the second circuit 502, three inverters are serially connected. The selector 503 comprises two nMOS transistors and two pMOS transistors for forming two switches 503*a* and 503*b* and one inverter. Further, the selector 503 comprises a selecting pin 404 connected to the switches 503*a* and 503*b* and the inverter.

When a high-level potential is applied to the selecting pin 404, the switch 503*a* is switched on and the switch 503*b* is switched off. On the contrary, when a low-level potential is applied to the selecting pin 404, the switch 503*a* is switched off and the switch 503*b* is switched on. In other words, when the high-level potential is applied to the selecting pin 404, the delay time of the first delay circuit 501 is selected. When the low-level potential is applied to the selecting pin 404, the delay time of the second delay circuit 502 is selected. The selected delay time and the delay time in the external delay replica 50 contribute to the generation of the internal clock signal CLKint.

As will obviously be understood with reference to FIG. 3, the delay time of the first delay circuit 501 is longer than the delay time of the second delay circuit 502. Therefore, when the first sub-frequency band is lower than the second sub-frequency band, as will be described later, the first delay circuit 501 corresponds to the first sub-frequency band and the second delay circuit corresponds to the second sub-frequency band.

On the other hand, the output unit of the register is formed as follows. That is, when the high-level potential is applied to the selecting pin 404, a signal is transmitted via the pre-drive 406, thereby adding a longer delay time. When the low-level potential is applied to the selecting pin 404, a signal bypasses the pre-drive 406, thereby adding a shorter delay time.

As will be understood with reference to FIGS. 2 and 3, the delay time of the output buffer in the register 40 and the delay time of the internal delay replica 403 are easily switched outside the register 40 by the selecting pin 404. The selecting pin 404 may be provided together with another pin of the memory module or may use an output of a mode flip-flop arranged in the register 40.

Referring back to FIG. 2, C/A signals CAin_i to CAin_j (S120 in FIG. 1) propagated via the external C/A bus 120 are subjected to internal C/A signal generation processing every signal according to the embodiment. In the following, one C/A signal CAin_j is described as an example.

The C/A signal CAin_j is inputted to the register 40. Then, the inputted C/A signal CAin_j is compared with a reference voltage Vref by an input circuit 405 for CA signal, and is converted into a C/A signal CAint which is obtained by suppressing the influence of the change in voltage. The inverter is arranged to the input circuit 405 for CA signal and the C/A signal CAint is an inverse signal of the C/A signal CAin_j. Incidentally, referring to FIG. 5, as will be described later, the C/A signal CAint denotes a true signal for purpose of a brief description, and is inputted to a data input terminal D of an flip-flop FF.

The flip-flop FF is a positive-edge-trigger-type flip-flop. The internal clock signal CLKint is inputted to a clock input terminal CK of the flip-flop FF. The flip-flop FF latches the C/A signal CAint inputted to the data input terminal D at a positive edge (rising edge) of the internal clock signal CLKint inputted to the clock input terminal CK. The flip-flop FF continuously outputs the latched data (value of the C/A signal CAint) from a data output terminal Q as an intermediate C/A signal until the next positive edge.

The intermediate C/A signal is set via the output unit of the register 40 and is further transmitted to the internal C/A bus 130 as an internal C/A signal CAout_j (S130 in FIG. 1). As mentioned above, the output unit of the register 40 includes the drive (internal C/A bus drive) comprising the pre-drive 406 and the output inverter 407. The internal C/A signals CAout_i to CAout_j are propagated to the internal C/A bus 130 and are supplied to the DRAM device 60.

Figure 4:
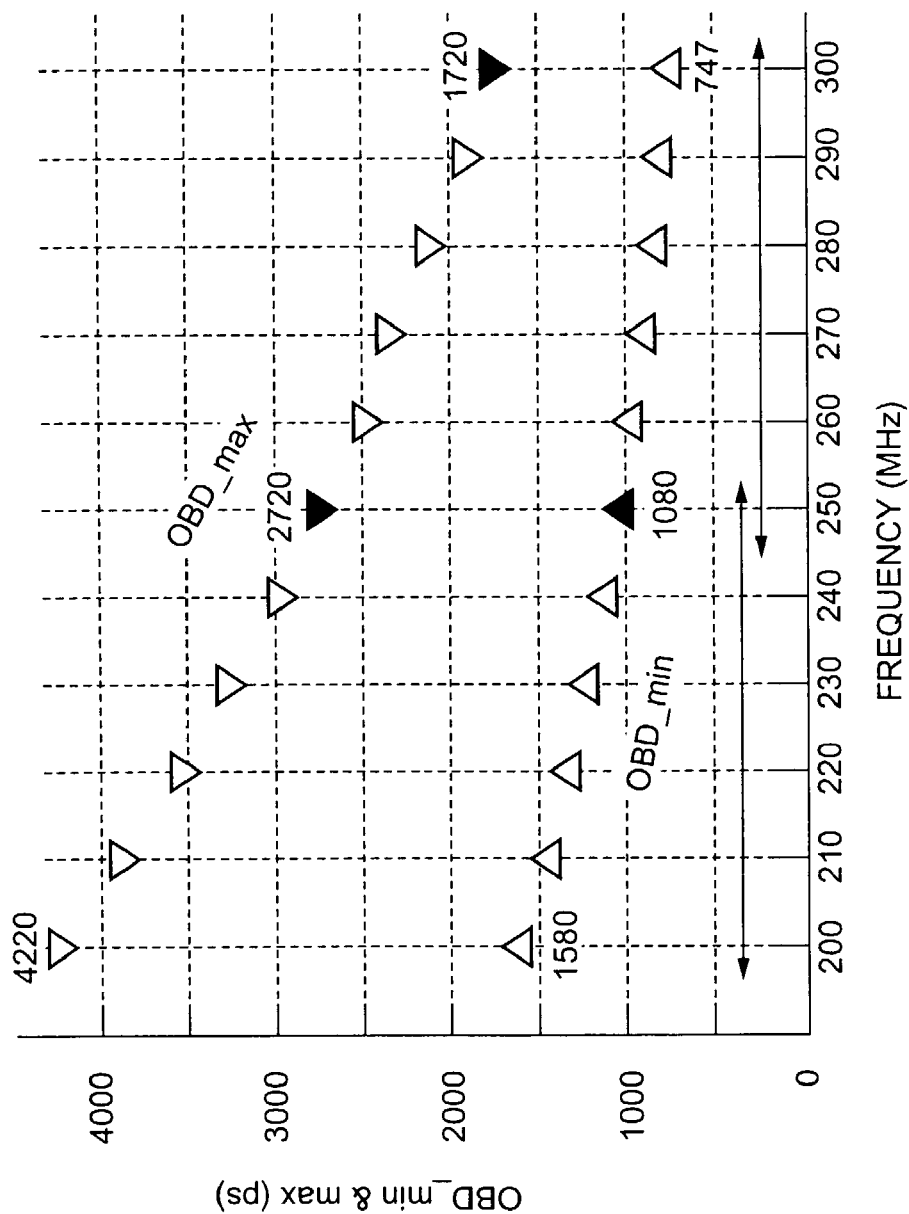
FIG. 4 is a diagram showing the frequency dependence of delay in an output unit in the register.
Figure 5:
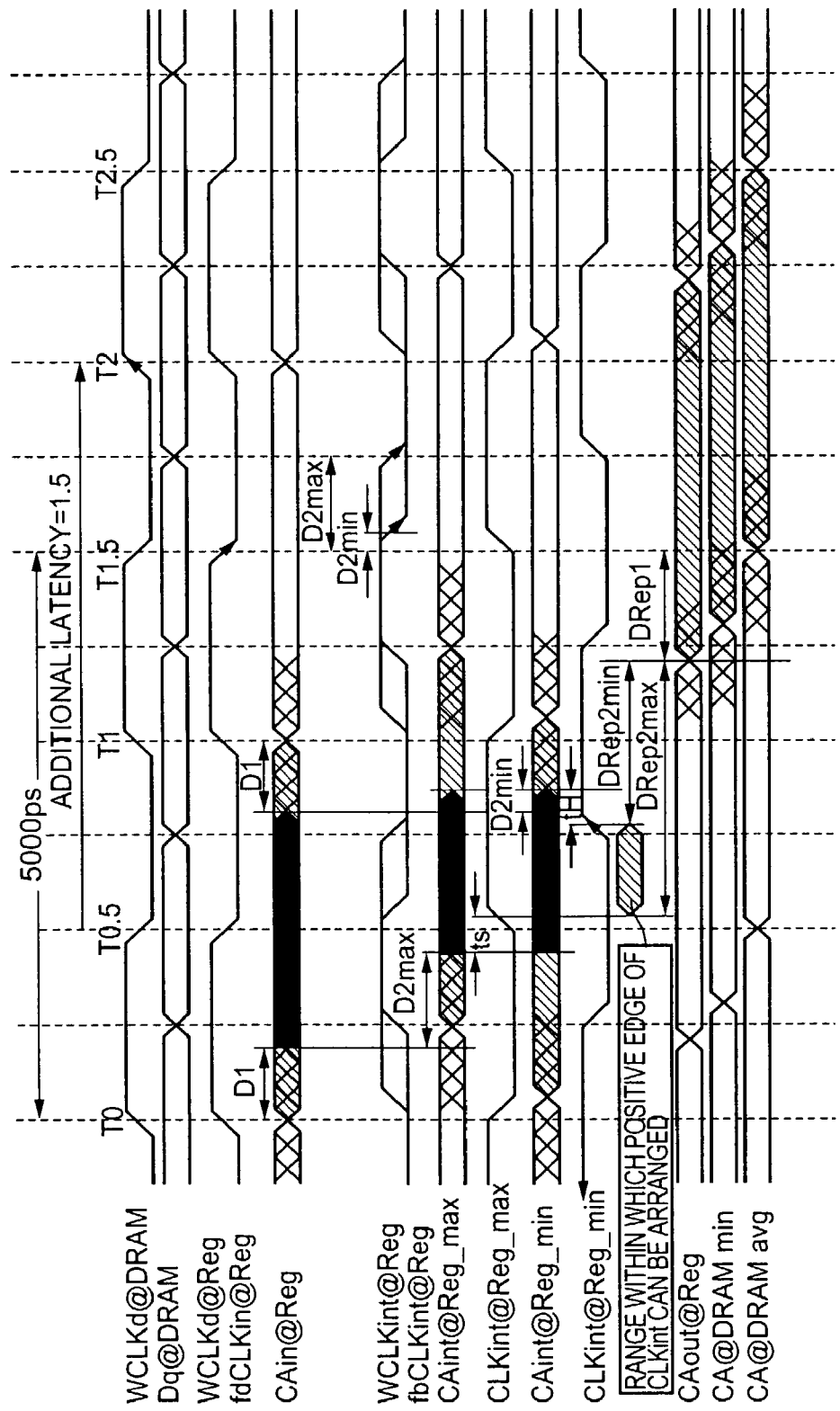
FIG. 5 is a timing diagram showing the operation of the register shown in FIG. 2.

Next, a description is given of the operating principle of the register and the like by using specific numbers according to the embodiment with reference to FIGS. 4 and 5.

FIG. 4 shows frequency characteristics of the delay of the output buffer, which are requested to the output buffer of the register 40. The delay of the output buffer means delay in the output unit of the register 40, and is abbreviated to OBD in the following.

FIG. 5 shows a timing diagram in the case in which the external clock signal WCLK is 300 MHz.

Hereinbelow, a description is give of the structure and the operation in the above-mentioned register for purpose of clear understanding. The present invention is not limited to the following specific description.

According to the embodiment, in the memory system, it is assumed that the used frequency band is 200 to 300 MHz and the number of memory devices mounted on one memory module 30 is 4 to 18. A load on the memory module 30 is adjusted. That is, when a delay time from the register 40 to the DRAM device 60 (propagation delay time on the internal C/A bus 130) is 1600 ps in the case of the eighteen memory devices, it is 1600 ps in the case of the four memory devices. The delay time of the external delay replica 50 is also 1600 ps.

Under the above premise, characteristics as shown in FIG. 4 are obtained by checking the frequency characteristics of a maximum value and a minimum value (OBD_max and OBD_min) of the delay time of the output buffer, which satisfy the set-up time and the hold time of the flip-flop FF in the register 40.

As will obviously be understood by the characteristics in FIG. 4, when the used frequency band is 200 to 300 MHz, the single output buffer covers the frequency band. In the case of using the internal delay replica which can set only one amount of delay, it is necessary that the maximum value of the amount of delay is set to 1720 ps and the minimum value is 1580 ps. In other words, a time zone width in which the rising edge of the internal clock signal CLKint can exist is only 140 ps (=1720–1580 ps).

According to the embodiment, since it is extremely difficult that the above output buffer, that is, the internal delay replica is formed by using the current technology, the used frequency band (200 to 300 MHz) is divided into two sub-frequency bands of 200 to 250 MHz and 250 to 300 MHz which have a boundary of 250 MHz.

Referring to FIG. 4, in the case of dividing the used frequency band into the two sub-frequency bands having the boundary of 250 MHz, the following will be understood. That is, in the case of a first sub-frequency band of 200 to 250 MHz, the amount of delay of the output buffer, namely, of the internal delay replica 403 may have a maximum value of 2720 ps and a minimum value of 1580 ps. In the case of a second sub-frequency band of 250 to 300 MHz, the amount of delay of the output buffer, namely, of the internal delay replica 403 may have a maximum value of 1720 ps and a minimum value of 1080 ps. Consequently, the difference between the maximum value and the minimum value of the amount of delay of the output buffer (internal delay replica) is 1140 ps (maximum value/minimum value= approximately 1.72) in the first sub-frequency band and it is 640 ps (maximum value/minimum value=approximately 1.59) in the second sub-frequency band. This means that the maximum value/minimum values in both the first and second sub-frequency bands are values which can be sufficiently allowable.

According to the embodiment, based on the above principle, the used frequency band is divided into two bands and the delay times corresponding to the two frequency bands are set to the output buffer unit and the internal delay replica 403 so as to be switched. Further, the selecting pin 404 is provided so as to facilitate the switching of the delay times outside the register 40. More specifically, the internal delay replica 403 has the first delay circuit 501 and the second delay circuit 502 which are selected by the selector 503 in accordance with the signal inputted to the selecting pin 404.

In consideration of the example shown in FIG. 4, the first delay circuit 501 corresponds to the frequency band of 200 to 250 MHz (first sub-frequency band), and the second delay circuit 502 corresponds to the frequency band of 250 to 300 MHz (second sub-frequency band).

FIG. 5 shows a timing diagram of the memory system having the above-structured register 40. Referring to FIG. 5, reference symbol D1 denotes a delay skew due to the change in access time of the C/A signal in the chip set 20 and the channel difference in the external C/A bus 120. Reference symbol D2 denotes delay of the input circuit 405 for C/A signal. Reference symbol DRep1 denotes a delay time of the external delay replica 50, which is fixed and set to a predetermined value (1600 ps). Reference symbol DRep2 denotes a delay time of the internal delay replica 403 and is set to have a maximum value DRep2max and a minimum value DRep2min so as to match the delay time of the output buffer. Incidentally, in the example, the external clock signal WCLK is 300 MHz and, therefore, the maximum value DRep2max and the minimum value DRep2min of the delay time of the internal delay replica 403 are 1720 ps and 1080 ps, respectively.

When the internal delay replica 403 and the external delay replica 50 are set as mentioned above, a frequency band at which a positive edge of the internal clock signal CLKint can exist is a frequency band (window shown by a hatched portion) which forms the difference between the maximum value DRep2max and the minimum value DRep2min of the delay time of the internal delay replica 403.

Further, as will be understood with reference to FIG. 5, according to the embodiment, in order to observe whether or not a set-up time (tS) and a hold time (tH) are sufficiently held, the latch operation in the register 40 is performed as follows. That is, a start point of the set-up time (tS) is determined in consideration of the maximum value D2max of the delay time of the input circuit 405 and an end point of the hold time (tH) is determined in consideration of the minimum value D2min of the delay time of the input circuit 405.

Referring to FIG. 5, it can obviously be understood that the set-up time (tS) and the hold time (tH) are sufficiently ensured even if the internal clock signal CLKint rises at any time point in the existing frequency band thereof.

Further, the used frequency band is divided into a plurality of sub-frequency bands in consideration of the frequency dependence of the delay of the output buffer, and the maximum value DRep2max and the minimum value DRep2min of the delay time of the internal delay replica 403 can be realized. Thus, the maximum value DRep2max and the minimum value DRep2min of the delay time of the internal delay replica 403 are switched to approximate values depending on to which sub-frequency band the actual used frequency belongs. As a result, as long as the used frequency is within the assumed used frequency band, the set-up time (tS) and the hold time (tH) are sufficiently endured corresponding to any frequency. In the DRAM device 60, the rising edge of the external clock signal is formed in the middle of the CA signal (at a timing T2 in FIG. 5). Therefore, similarly, the set-up time (tS) and the hold time (tH) are sufficiently endured.

As will obviously be understood with reference to FIG. 5, the necessary number of external clocks from the falling edge of the external clock signal WCLK for fetching the C/A signal to the register 40 to the timing for using the C/A signal in the DRAM device 60 (namely, additional latency) is suppressed to 1.5.

Although the present invention is described by indicating the embodiment as an example, it is not limited to this. For example, according to the embodiment, the delay FF (D-FF) as the flip-flop is shown as an example. However, another flip-flop may be used in place of the above-mentioned D-FF without departing the concept of the present invention.

As stated above, in the present invention, the external delay replica is set and fixed in advance so as to correspond to the maximum value of the number of mounted memory devices. Further, in the present invention, the desired frequency band is divided into a plurality of sub-frequency bands, and the output buffer and the internal delay replica are switched and used every sub-frequency band. As a consequence, the actual maximum value and the minimum value can be set to the output buffer and the internal delay replica. Thus, as long as the number of memory devices having the desired frequency band does not exceed the permittable number of memory devices, it is possible to sufficiently ensure the set-up time and the hold time for the latch operation in the register irrespective of the frequency level and the number of mounted memory devices. In particular, the above-mentioned advantage is remarkable when the operating frequency band is 200 MHz or more. When the operating frequency is not more than 300 MHz, the above advantage can easily be realized as exemplified above.

What is claimed is:

1. A register mounted on a memory module including a plurality of memory devices, said register receiving an external clock signal and one of a command or an address signal from a chip set outside said memory module, generating an internal clock signal from said external clock signal, fetching said one of a command or an address signal in accordance with said internal clock signal, and thus generating one of an internal command or an internal address signal for said memory device, wherein:

said register is connected to an external delay replica indicating a propagation delay time corresponding to a reach time of said one of an internal command or an internal address signal to said plurality of memory devices;

said register comprising:

an internal delay replica indicating a delay time from said internal clock signal to generation of said one of an internal command or an internal address signal corresponding to said internal clock signal;

a delay locked loop circuit forming a delay control loop together with said internal delay replica and said external delay replica, said delay locked loop circuit front-loading said external clock signal by a predetermined time indicated by said internal delay replica and said external delay replica and generating said internal clock signal;

a flip-flop for latching said one of a command or an address signal in accordance with said internal clock signal and generating one of an intermediate command or an intermediate address signal; and an output unit for buffering said one of an intermediate command or an intermediate address signal and outputting said one of an internal command or an internal address signal, said output unit and said internal delay replica having a plurality of switchable delay times.

2. A register according to claim 1, further comprising:

selecting means for selecting outside said register, one of said plurality of delay times of said output unit and said internal delay replica.

3. A register according to claim 1, wherein said output unit comprises a drive including a plurality of pre-drives and an output inverter.

4. A register according to claim 1, wherein said external delay replica and said internal delay replica are used commonly for all said memory devices, respectively, as long as the number of memory devices is within a predetermined number range.

5. A register according to claim 4, wherein said external delay replica is set corresponding to the case in which the number of memory devices matches a maximum value within said predetermined number range.

6. A register according to claim 5, wherein said predetermined number range is not less than 4 and is not more than 18.

7. A register according to claim 6, wherein frequencies of said external clock signal and said internal clock signal are not less than 200 MHz and are not more than 300 MHz.

8. A register according to claim 7, wherein said internal delay replica has a first delay time corresponding to the case in which the frequencies of said external clock signal and said internal clock signal are not less than 200 MHz and are not more than 250 MHz and a second delay time corresponding to the case in which the frequencies of said external clock signal and said internal clock signal are more than 250 MHz and are not more than 300 MHz.

9. A register according to claim 8, wherein the propagation delay time set to said external delay replica is 1600 ps, said first delay time of said internal delay replica has a maximum value of 2720 ps and a minimum value of 1580 ps, and said second delay time of said internal delay replica has a maximum value of 1720 ps and has a minimum value of 1080 ps.

10. A memory module comprising the register according to claim 1, the external delay replica connected to said register, and the plurality of memory devices, wherein a propagation delay time corresponding to a reach time of said one of an internal command or an internal address signal from said register to said plurality of memory devices matches a time in the case in which the number of said memory devices is maximum within a predetermined number range.

11. A memory system comprising a memory module according to claim 10 and a chip set for supplying said external clock signal and said one of a command or an address signal to said memory module.

12. A memory system including a register mounted on a memory module comprising a plurality of memory devices, said register receiving an external clock signal and one of a command or an address signal from a chip set outside the memory module and generating one of an internal command or an internal address signal for one of said plurality of memory devices, wherein said register comprises a delay locked loop circuit for receiving said external clock signal and generating an internal clock signal in accordance with a predetermined delay time, and a necessary number of external clocks from a falling edge of said external clock signal for fetching said one of a command or an address signal to said register to a timing for fetching said one of an internal command or an internal address signal corresponding to said one of a command or an address signal into said one of said plurality of memory devices by said external clock signal is 1.5.

13. A signal generating method using a register mounted on a memory module comprising a plurality of memory devices, said register receiving an external clock signal and one of a command or an address signal from a chip set outside the memory module and generating one of an internal command or an internal address signal for said memory device, said register comprising a delay locked loop circuit for controlling the delay of a plurality of said external clock signals and for generating said internal clock signal by using a first delay replica having a propagation delay time corresponding to a reach time of said one of an internal command or an internal address signal to one of said plurality of memory devices and a second delay replica indicating a delay time of an output unit in said register, and a flip-flop for latching said one of a command or an address signal and for generating a signal corresponding to said one of an internal command or an internal address signal, said signal generating method for, as long as a frequency of said external clock signal belongs to a predetermined frequency band and the number of said memory devices belongs to a predetermined number range, generating said one of an internal command or an internal address signal corresponding to any level of said frequency of said external clock signal and any number of said memory devices, said signal generating method comprising the steps of:

fixing and setting said first delay replica corresponding to a maximum value within said predetermined number range;

dividing said predetermined frequency band into a plurality of sub-frequency bands;

setting the delay time indicated by said second delay replica to be switched for each of said plurality of sub-frequency bands; and switching said delay time of said second delay replica in accordance with said sub-frequency band, to which the frequency of said external clock signal that is actually used belongs, among said plurality of sub-frequency bands.

14. A signal generating method according to claim 13, wherein said predetermined number range is not less than 4 and is not more than 18, and said predetermined frequency band is not less than 200 MHz and are not more than 300 MHz.

15. A signal generating method according to claim 13, wherein said predetermined frequency band is divided into two said sub-frequency bands.

16. A signal generating method according to claim 15, wherein said two sub-frequency bands include a first sub-frequency band as a frequency band which is not less than 200 MHz and is not more than 250 MHz and a second sub-frequency band as a frequency band which is more than 250 MHz and is not less than 300 MHz.

17. A signal generating method according to claim 16, wherein the delay time of said first delay replica is fixed and set to 1600 ps, and the delay time of said second delay replica has said first sub-frequency band of a minimum value of 1580 ps and a maximum value of 2720 ps and said second sub-frequency band of a minimum value of 1080 ps and a minimum value of 1720 ps.

18. A register mounted on a memory module having a plurality of memory devices, said register comprising:

a delay replica having a plurality of delay circuits having different delay times; corresponding to the plurality of memory devices;

a delay locked loop circuit being controlled by at least said delay replica and generating an internal clock based on an external clock; and a flip-flop for latching at least one of a command signal and an address signal in response to said internal clock and outputting the latched signal as at least one of an internal command signal and an internal address signal.

* * * * *